United States Patent
Adachi et al.

(10) Patent No.: US 11,139,422 B2
(45) Date of Patent: Oct. 5, 2021

(54) THERMOELECTRIC CONVERSION MATERIAL, THERMOELECTRIC CONVERSION ELEMENT, THERMOELECTRIC CONVERSION MODULE AND OPTICAL SENSOR

(71) Applicant: SUMITOMO ELECTRIC INDUSTRIES, LTD., Osaka (JP)

(72) Inventors: Masahiro Adachi, Osaka (JP); Makoto Kiyama, Osaka (JP); Yoshiyuki Yamamoto, Osaka (JP); Ryo Toyoshima, Osaka (JP)

(73) Assignee: SUMITOMO ELECTRIC INDUSTRIES. LTD., Osaka (JP)

( * ) Notice: Subject to any disclaimer, the term of this patent is extended or adjusted under 35 U.S.C. 154(b) by 60 days.

(21) Appl. No.: 16/619,647

(22) PCT Filed: Apr. 11, 2018

(86) PCT No.: PCT/JP2018/015154
§ 371 (c)(1),
(2) Date: Dec. 5, 2019

(87) PCT Pub. No.: WO2018/225374
PCT Pub. Date: Dec. 13, 2018

(65) Prior Publication Data
US 2020/0203591 A1 Jun. 25, 2020

(30) Foreign Application Priority Data
Jun. 7, 2017 (JP) .............................. JP2017-112986

(51) Int. Cl.
*H01L 35/26* (2006.01)
*G01J 5/12* (2006.01)
(Continued)

(52) U.S. Cl.
CPC ................ *H01L 35/26* (2013.01); *G01J 5/12* (2013.01); *H01L 27/16* (2013.01); *H01L 35/08* (2013.01);
(Continued)

(58) Field of Classification Search
CPC ......... H01L 35/26; H01L 27/16; H01L 35/08; H01L 35/16; H01L 35/22; H01L 35/32;
(Continued)

(56) References Cited

U.S. PATENT DOCUMENTS

| | | | | |
|---|---|---|---|---|
| 2003/0047816 A1* | 3/2003 | Dutta | ..................... | C09D 11/52 257/788 |
| 2007/0128808 A1* | 6/2007 | Choi | ....................... | C30B 29/60 438/270 |
| 2009/0053522 A1* | 2/2009 | Sekiguchi | .............. | C09K 11/62 428/375 |
| 2009/0263956 A1* | 10/2009 | Amirav | .................. | B82Y 30/00 438/478 |

(Continued)

FOREIGN PATENT DOCUMENTS

WO  WO-2015/093207 A1  6/2015

OTHER PUBLICATIONS

Adachi, Masahiro et al., "Control of Nano Structure by Multi Films for Nano-structured Thermoelectric Materials," SEI Technical Review, Apr. 2017, No. 84, pp. 151-155.
(Continued)

*Primary Examiner* — David P Porta
*Assistant Examiner* — Gisselle M Gutierrez
(74) *Attorney, Agent, or Firm* — Faegre Drinker Biddle & Reath LLP

(57) ABSTRACT

A thermoelectric conversion material contains a matrix composed of a semiconductor and nanoparticles disposed in the matrix, and the nanoparticles have a lattice constant distribution Δd/d of 0.0055 or more.

18 Claims, 6 Drawing Sheets

(51) Int. Cl.
  *H01L 27/16*   (2006.01)
  *H01L 35/08*   (2006.01)
  *H01L 35/16*   (2006.01)
  *H01L 35/22*   (2006.01)
  *H01L 35/32*   (2006.01)
  *H01L 35/34*   (2006.01)

(52) U.S. Cl.
  CPC .............. *H01L 35/16* (2013.01); *H01L 35/22* (2013.01); *H01L 35/32* (2013.01); *H01L 35/34* (2013.01)

(58) Field of Classification Search
  CPC ......... H01L 35/34; H01L 29/06; H01L 35/14; G01J 5/12; G01J 5/023; G01J 5/024; G01J 5/046; G01J 5/0853; B82Y 20/00; B82Y 30/00; H02N 11/00
  USPC ..................................................... 252/62.3 T
  See application file for complete search history.

(56) References Cited

U.S. PATENT DOCUMENTS

| 2013/0284987 | A1 | 10/2013 | Lee et al. | |
| 2015/0214433 | A1* | 7/2015 | Tran | C23C 10/24 |
| | | | | 257/13 |
| 2016/0300994 | A1* | 10/2016 | Adachi | H01L 35/34 |
| 2019/0165211 | A1* | 5/2019 | Schmidtke-Tran | C23C 10/24 |
| 2019/0229153 | A1* | 7/2019 | Park | C09K 11/0883 |

OTHER PUBLICATIONS

Adachi, Masahiro et al., "Control of Nano Structure by Multi Films for Nano-Structured Thermoelectric Materials," SEI Technical Review, Jan. 2017, No. 190, pp. 143-147.

Takiguchi, Hiroaki et al., "Nano Structural and Thermoelectric Properties of SiGeAu Thin Films," Japanese Journal of Applied Physics, Apr. 20, 2011, vol. 50, pp. 041301-1-041301-5.

* cited by examiner

THERMOELECTRIC CONVERSION MATERIAL, THERMOELECTRIC CONVERSION ELEMENT, THERMOELECTRIC CONVERSION MODULE AND OPTICAL SENSOR

TECHNICAL FIELD

The present disclosure relates to a thermoelectric conversion material, a thermoelectric conversion element, a thermoelectric conversion module, and an optical sensor. The present application claims priority to Japanese Application No. 2017-112986 filed Jun. 7, 2017, the entire contents of which are incorporated herein by reference.

BACKGROUND ART

In recent years, renewable energy has gathered much attention as the clean energy that replaces fossil fuels such as petroleum. Examples of the renewable energy include not only power generation using solar energy, hydraulic energy, and wind energy, but also power generation by thermoelectric conversion using temperature differences. In thermoelectric conversion, since heat is directedly converted to electricity, no superfluous waste is generated during conversion. In addition, thermoelectric conversion is characteristic in that the maintenance of the facility is simple since driving units such as motors are not required. There are also optical sensors, such as infrared sensors, that utilize thermoelectric conversion.

The efficiency $\eta$ of converting the temperature difference (thermal energy) to electrical energy using a material for performing thermoelectric conversion (thermoelectric conversion material) is given by formula (1) below:

$$\eta = \Delta T/T_h \cdot (M-1)/(M+T_c/T_h) \quad (1)$$

where $\eta$ represents the conversion efficiency, $\Delta T = T_h - T_c$, $T_h$ represents the high-temperature-side temperature, $T_c$ represents the low-temperature-side temperature, $M=(1+ZT)^{1/2}$, $ZT=\alpha^2 ST/\kappa$, ZT represents the dimensionless figure of merit, $\alpha$ represents the Seebeck coefficient, S represents the electrical conductivity, and $\kappa$ represents the thermal conductivity. As such, the conversion efficiency is a monotonically increasing function of ZT.
In developing the thermoelectric conversion material, it is critical to increase ZT.

There has been reported a technique of forming silicon germanium (SiGe) nanoparticles by performing annealing after Si, Ge, and Au serving as semiconductor materials are layered (for example, refer to NPL 1).

CITATION LIST

Non Patent Literature

NPL 1: Japanese Journal of Applied Physics, 50 (2011) 041301

SUMMARY OF INVENTION

A thermoelectric conversion material according to the present disclosure contains a matrix consisting of a semiconductor, and nanoparticles disposed in the matrix. The lattice constant distribution $\Delta d/d$ of the nanoparticles is 0.0055 or more.

DESCRIPTION OF EMBODIMENTS

Figure 1:
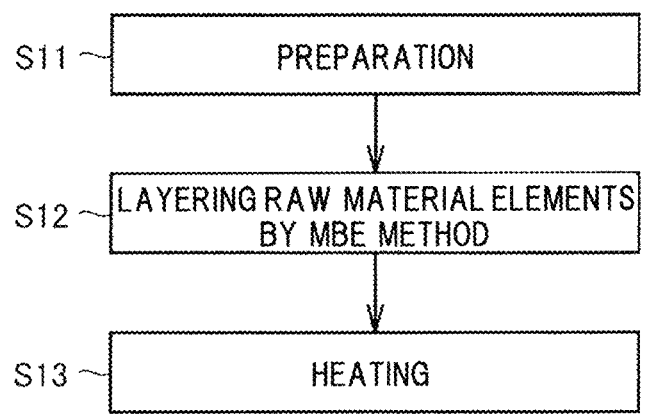
FIG. 1 is a flowchart illustrating representative steps of a method for producing a thermoelectric conversion material according to embodiment 1.

From the viewpoint of increasing ZT, decreasing the thermal conductivity $\kappa$ in formula (1) above is considered. Here, having nanoparticles in the matrix constituting the thermoelectric conversion material can enhance phonon scattering by the nanoparticles, and, thus, the thermal conductivity can be decreased.

Recently, thermoelectric conversion materials have been required to further decrease thermal conductivity from the viewpoint of further improving the thermoelectric conversion efficiency. Such a requirement cannot be met by the technique disclosed in NPL 1 described above.

Thus, one of the objects of the present disclosure is to provide a thermoelectric conversion material with improved thermoelectric conversion efficiency.

DESCRIPTION OF EMBODIMENTS OF PRESENT DISCLOSURE

First, embodiments of the present disclosure are listed and described. A thermoelectric conversion material according to the present disclosure contains a matrix composed of a semiconductor and nanoparticles disposed in the matrix, and the nanoparticles have a lattice constant distribution $\Delta d/d$ of 0.0055 or more.

The thermoelectric conversion material contains a matrix composed of a semiconductor. A semiconductor has a larger bandgap than conductive materials and thus can increase the Seebeck coefficient and the dimensionless figure of merit ZT. Furthermore, since the thermoelectric conversion material contains nanoparticles disposed in the matrix, etc., phonon scattering can be enhanced. Thus, the thermal conductivity can be decreased, and the dimensionless figure of merit ZT can be increased.

Here, regarding the nanoparticles disposed in the matrix of the thermoelectric conversion material, the inventors have conceived of further decreasing the thermal conductivity by increasing variation in nanoparticle composition and crystal strain, in other words, variation in lattice constant of the nanoparticles. This is based on the idea that presence of nanoparticles with various lattice constants promotes scattering of various phonons having different frequencies. In the present disclosure, the thermal conductivity can be sufficiently decreased by setting the lattice constant distribution Δd/d of the nanoparticles to 0.0055 or more.

Thus, such a thermoelectric conversion material can sufficiently increase the dimensionless figure of merit ZT, and can improve the thermoelectric conversion efficiency.

The matrix may be configured to be amorphous. In this manner, the thermal conductivity of the matrix, which constitutes the thermoelectric conversion material and in which nanoparticles are disposed, can be decreased. Thus, the dimensionless figure of merit ZT can be increased, and the thermoelectric conversion efficiency can be further improved.

The lattice constant distribution Δd/d of the nanoparticles may be 0.04 or less. In this range, it is easier to form the thermoelectric conversion material of the present disclosure.

The nanoparticles may have a particle diameter of 20 nm or less. In this manner, the Seebeck coefficient can be increased, and, thus, the dimensionless figure of merit ZT can be increased. Thus, thermoelectric conversion efficiency can be further improved.

Alternatively, the semiconductor may be a SiGe-based material containing Si and Ge, an AlMnSi-based material containing Al, Mn, and Si, or a BiTe-based material containing Bi and Te. Such a base material for the semiconductor is preferable in the thermoelectric conversion material of the present disclosure.

The thermoelectric conversion material may contain, as an additive element, at least one of Au, Cu, Al, B, Ni, and Fe. Such an additive element is preferable as an additive element that causes precipitation of nanoparticles in the matrix in the thermoelectric conversion material of the present disclosure.

A thermoelectric conversion element of the present disclosure includes a thermoelectric conversion material unit, a first electrode disposed to be in contact with the thermoelectric conversion material unit, and a second electrode disposed to be in contact with the thermoelectric conversion material unit but apart from the first electrode. The thermoelectric conversion material unit is composed of the thermoelectric conversion material of the present disclosure described above, in which the component composition is adjusted to set the conductivity type to p-type or n-type.

In the thermoelectric conversion element of the present disclosure, the thermoelectric conversion material unit is composed of the aforementioned thermoelectric conversion material having excellent thermoelectric conversion properties in which the component composition is adjusted to set the conductivity type to p-type or n-type. Thus, according to the thermoelectric conversion element of the present disclosure, a thermoelectric conversion element having excellent conversion efficiency can be provided.

A thermoelectric conversion module of the present disclosure includes multiple thermoelectric conversion elements described above. According to the thermoelectric conversion module of the present application, since multiple thermoelectric conversion elements of the present application having excellent thermoelectric conversion efficiency are included, a thermoelectric conversion module having excellent thermoelectric conversion efficiency can be obtained.

An optical sensor of the present disclosure includes the thermoelectric conversion module described above. According to the optical sensor of the present disclosure, the aforementioned thermoelectric conversion material having a sufficiently low thermal conductivity value is employed. Thus, the optical sensor of the present disclosure can exhibit high sensitivity.

DETAILED DESCRIPTION OF EMBODIMENTS OF PRESENT DISCLOSURE

Next, one embodiment of the thermoelectric conversion material of the present disclosure is described with reference to the drawings. In the drawings described below, the same or corresponding parts are denoted by the same reference signs, and the descriptions therefor are not repeated.

Embodiment 1

First, a method for producing a thermoelectric conversion material according to embodiment 1 is briefly described. FIG. 1 is a flowchart illustrating representative steps of a method for producing a thermoelectric conversion material according to embodiment 1. Referring to FIG. 1, a material for a base substrate, such as a sapphire substrate, is prepared (step S11 in FIG. 1, hereinafter "step" is omitted).

Next, raw material elements constituting the thermoelectric conversion material are layered on the sapphire substrate. In this case, for example, a molecular beam epitaxy (MBE) method is employed to sequentially layer the raw material elements (S12). Specifically, a layer of amorphous silicon (Si) among the raw material elements is formed on the sapphire substrate at a room temperature. Next, a layer of amorphous germanium (Ge), which is another raw material element, is formed on the formed amorphous Si layer. Subsequently, a layer of gold (Au) is formed on the amorphous Ge layer, and a layer of amorphous Ge is again formed on the Au layer. Specifically, the thicknesses of the respective layers are selected to be Ge: 1.8 nm (nanometers), Au: 0.1 nm, and Si: 1 nm, for example. In this case, Au is the additive element.

Figure 2:
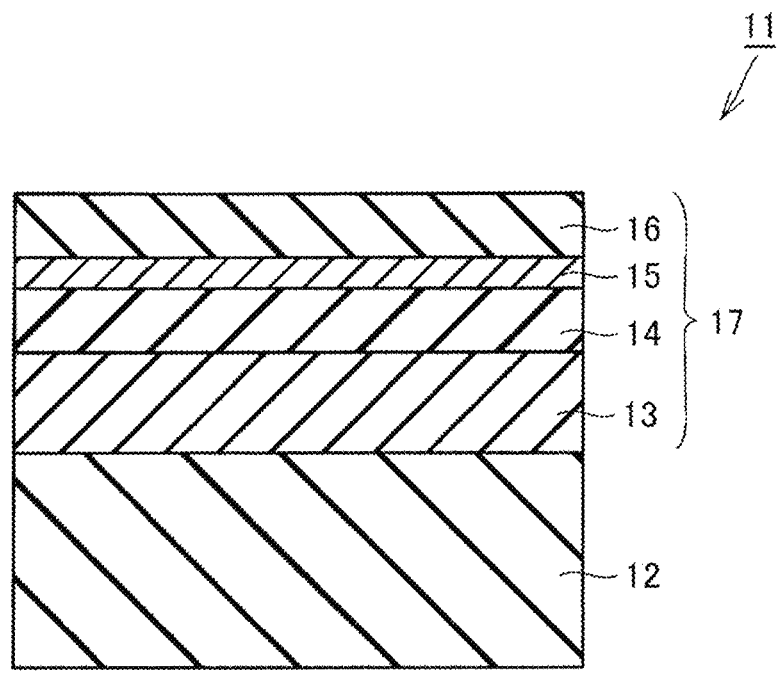
FIG. 2 is a schematic diagram of a cross-section of a part of a multilayer body, which is a thermoelectric conversion material in a state in which raw material elements are layered.

FIG. 2 is a schematic diagram of a cross-section of a part of a multilayer body 11, which is a thermoelectric conversion material in a state in which raw material elements are layered. FIG. 2 is a cross-sectional view obtained by cutting the multilayer body 11 in the thickness direction. Also referring to FIG. 2, an amorphous Si layer 13, an amorphous Ge layer 14, an Au layer 15, and another amorphous Ge layer 16 are formed on the sapphire substrate 12. A multilayer unit 17 constituted by the amorphous Si layer 13, the amorphous Ge layer 14, the Au layer 15, and another amorphous Ge layer 16 is repeatedly formed so as to layer the raw material elements. Layering is repeated until the total thickness reaches, for example, about 220 nm, and, as a result, the multilayer body 11 is formed. When the composition of the multilayer body 11 was measured by SEM-EDX (energy dispersive X-ray spectroscopy), the Au content was 3 at %.

Next, the multilayer body 11 obtained as such is heated (S13). In this case, the temperature is increased from room temperature to 650° C. at a rate of 10° C./min. In other words, an annealing treatment is performed by increasing the temperature relatively moderately. Nanoparticles having a particle diameter of about 6 nm are formed by precipitation, and thus a thermoelectric conversion material of embodiment 1 in which the matrix is amorphous and nanoparticles are disposed in the matrix is obtained.

Figure 3:
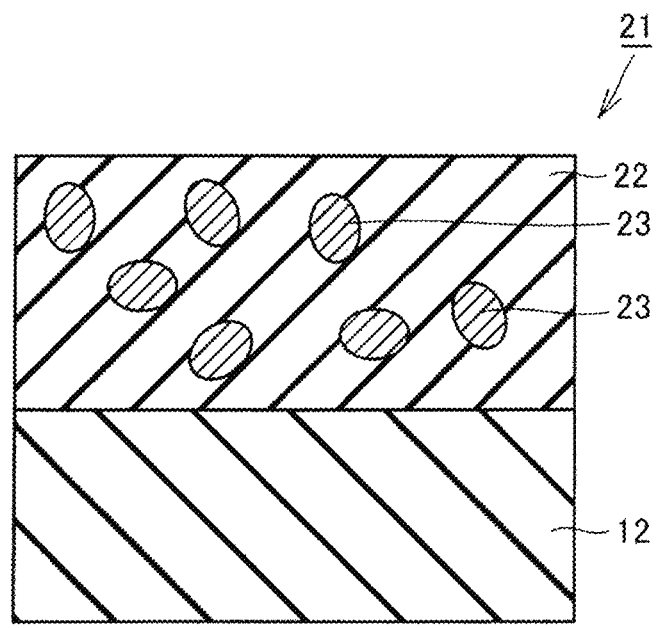
FIG. 3 is a schematic cross-sectional view of the thermoelectric conversion material according to embodiment 1.

FIG. 3 is a schematic cross-sectional view of a thermoelectric conversion material 21 according to embodiment 1 FIG. 3 is a cross-sectional view obtained by cutting the thermoelectric conversion material 21 in the thickness direction. Also referring to FIG. 3, the thermoelectric conversion material 21 of embodiment 1 is includes a matrix 22 composed of a semiconductor and mainly constituted by amorphous Si, amorphous Ge, and amorphous SiGe formed on the sapphire substrate 12, and nanoparticles 23 disposed in the matrix 22. In this case, the thermoelectric conversion material 21 is composed of a SiGe-based material containing Si and Ge as the base material for the semiconductor. The nanoparticles 23 are formed by precipitation from Au crystal nuclei, and are disposed in the matrix 22. The nanoparticles 23 are in a microcrystalline state and are dispersed in the matrix 22. One example of the specific structure of the nanoparticles 23 is a structure in which the component composition of the center region of each nanoparticle 23 is mainly composed of SiGe. As described above, the nanoparticles 23 have a particle diameter of, for example, about 6 nm.

Here, the lattice constant distribution $\Delta d/d$ of the nanoparticles 23 is set to 0.0055 or more. The lattice constant distribution $\Delta d/d$ is obtained by performing X-ray diffraction on the obtained thermoelectric conversion material 21 and analyzing the diffraction results using the Williamson-Hall plot.

Figure 4:
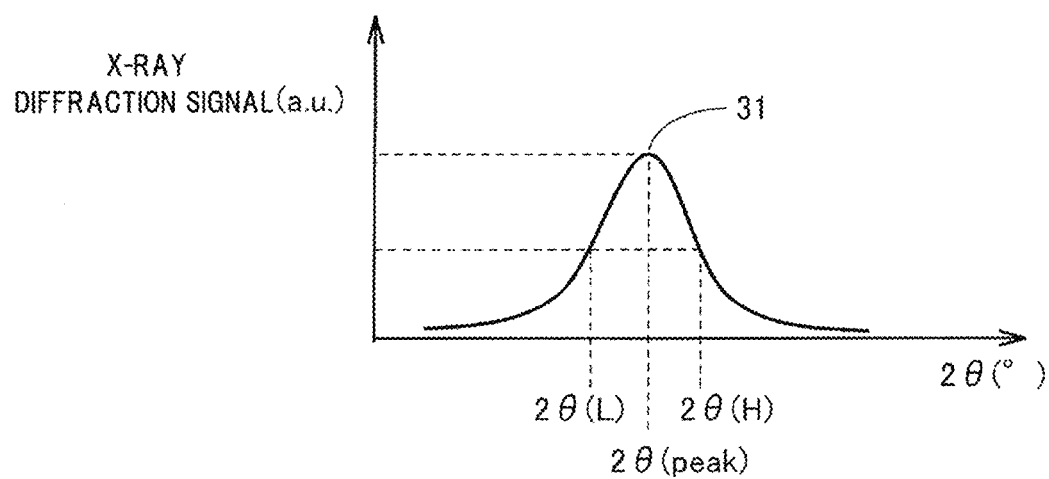
FIG. 4 is a graph indicating one example of a peak in an X-ray diffraction signal.

Next, the definition of the lattice constant distribution $\Delta d/d$ is described. FIG. 4 is a graph indicating one example of a peak in an X-ray diffraction signal. In FIG. 4, the vertical axis indicates the intensity (a.u.) of the X-ray diffraction signal, and the horizontal axis indicates $2\theta(°)$ where $\theta$ represents the diffraction angle.

Referring now to FIG. 4, first, assuming the position of a peak 31 in the X-ray diffraction signal to be at $2\theta(peak)$, the lattice constant d at the position of the peak 31 is determined. Here, since the relationship between the lattice constant and the diffraction angle is expressed by the relationship, $2d \sin \theta = n\lambda$ (d: lattice constant, $\lambda$: wavelength), this relationship is used. Next, the high-angle-side value at the signal position constituting the half value of the peak 31 is determined and is defined as $2\theta(H)$. Then, $2\theta(H)$ is used to determine the high-angle-side lattice constant d(H). In addition, the low-angle-side value at the signal position constituting the half value of the peak 31 is determined and is defined as $2\theta(L)$. Then, $2\theta(L)$ is used to determine the low-angle-side lattice constant d(L). In the lattice constant distribution $\Delta d/d$, $\Delta d$ is determined as d(H)–d(L). Lastly, the lattice constant distribution $\Delta d/d$ is determined as (d(H)–d(L))/d. Thus, the lattice constant distribution $\Delta d/d$ is defined. The lattice constant distribution $\Delta d/d$ indicated here is based on the shape of the peak 31 attributable to the crystals of a predetermined particle diameter as illustrated in FIG. 4.

In an actual system, since particle diameters vary, two or more X-ray diffraction signals must be analyzed, and the analysis must be performed by using a Williamson-Hall plot with which the lattice constant distribution and the particle diameter can be separated. The analysis example therefor is described below.

Figure 5:
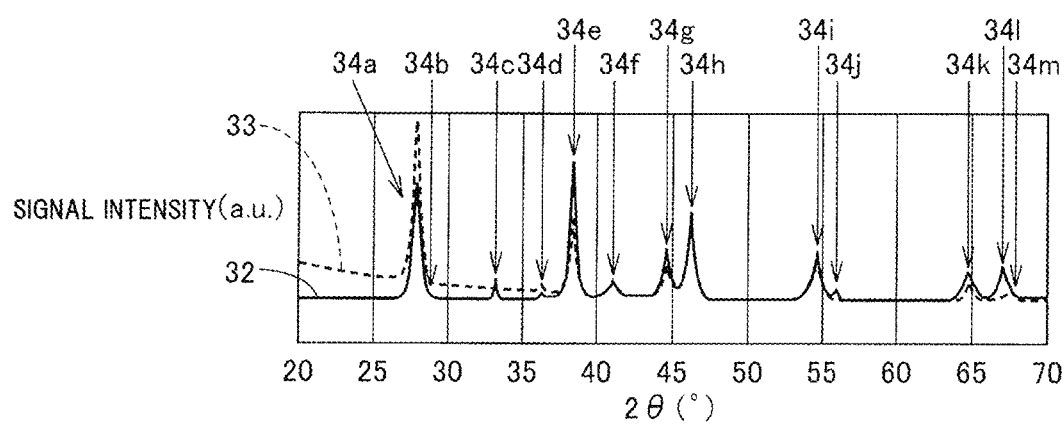
FIG. 5 is a graph indicating one example of an X-ray diffraction signal.

FIG. 5 is a graph indicating one example of an X-ray diffraction signal. In FIG. 5, the vertical axis indicates the intensity (a.u.) of the X-ray diffraction signal, and the horizontal axis indicates $2\theta(°)$ where $\theta$ represents the diffraction angle. In FIG. 5, $2\theta$ is set to 20° to 70°. Moreover, a solid line 32 indicates the case in which a radiated X-ray is used as the X-ray in the X-ray diffraction, and a broken line 33 indicates the case in which Cu K-$\alpha$ radiation is used as the X-ray in the X-ray diffraction. Moreover, FIG. 5 indicates the case in which the thickness of the Au layer 15, in other words, Au, is set to 0.35 nm before the heat treatment illustrated in FIG. 2 described above and then the heating step is completed, in other words, the state in which the nanoparticles 23 are precipitated. Note that the X-ray diffraction using the radiated X-ray is performed in a large-scale radiation facility, SPring-8. Moreover, in the graph of FIG. 5, the deviation between the solid line 32 and the broken line 33 is attributable to the difference in the type of X-ray used in the X-ray diffraction or the like.

The measurement conditions of the measurement using synchrotron radiation and SPring-8 are as follows: beamline: SPring-8 BL16XU, spectroscope/mirror: Si(111)/Rh coat mirror 3.5 mrad, photon energy: 18 keV (0.689 Å), detector: two-dimensional detector PILATUS 100K, camera length: 200 mm, slit width: 50 mm (H)×500 mm (V), incident angle: 0.5°, detector center angle: 19°, and exposure time: 3 seconds. The measurement conditions of the measurement using Cu K-$\alpha$ radiation are Xpert (45 kV, 40 mA) produced by Panalytical. When a general purpose X-ray diffraction facility is used, the influence of mixing of the Cu K-$\beta$ radiation on the high angle side becomes significant, and thus, the measurement is preferably conducted by using SPring-8 from the viewpoint of the measurement accuracy.

Referring to FIG. 5, for example, a peak 34a indicated by the solid line 32 and the broken line 33 at about 28° indicates SiGe. As such, in the diffraction signal, multiple peaks 34a, 34b, 34c, 34d, 34e, 34f, 34g, 34h, 34i, 34j, 34k, 34l, and 34m appear.

Regarding the X-ray diffraction results obtained as such, the inventors have focused on the fact that the information regarding the particle diameters of the nanoparticles and the lattice constant distribution of the nanoparticles is contained in the information regarding the half value widths of the peaks and the positions of the peaks in the diffraction signal. Thus, analysis is performed using the Williamson-Hall plot to separate the element regarding the particle diameters of the nanoparticles 23 and the element regarding the lattice constant distribution of the nanoparticles 23.

Figure 6:
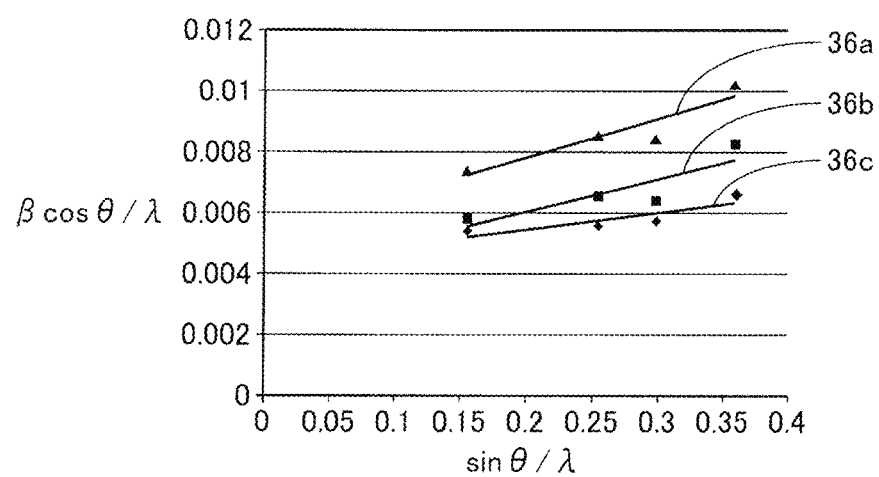
FIG. 6 is a graph indicating results of analysis using a Williamson-Hall plot.

FIG. 6 is a graph indicating results of analysis through a Williamson-Hall plot. In FIG. 6, the vertical axis indicates the value of $\beta \cos \theta/\lambda$, and the horizontal axis indicates the value of $\sin \theta/\lambda$. Four solid triangles, four squares, and four rhombuses in FIG. 6 respectively indicate the same sample. Here, $\beta$ represents the half value width, $\theta$ represents the diffraction angle, and $\lambda$ represents the wavelength of the X-ray. In FIG. 6, these values are plotted for four diffraction signals. For each of the samples, the plotted points were connected by straight lines 36a, 36b, and 36c. The straight line 36a indicates the sample in which the thickness of Au is set to 0.35 nm, the straight line 36b indicates the sample in which the thickness of Au is set to 0.17 nm, and the straight line 36c indicates the sample in which the thickness of Au is set to 0.10 nm. For these straight lines 36a to 36c, the relationship $\beta \cos \theta/\lambda = 2\eta \sin \theta/\lambda + 1/\varepsilon$ is satisfied, where $\eta$ represents the lattice constant distribution, $1/\varepsilon$ represents the particle diameter, and $\beta \cos \theta$ and $\sin \theta$ represent variables. In other words, the slope $2\eta$ of the straight line indicates the lattice constant distribution $\Delta d/d$, and the intercept $1/\varepsilon$ indicates the particle diameter.

The relationship between the thickness (nm) of Au, the particle diameter (nm), and the lattice constant distribution ($\Delta d/d$) derived from the straight lines 36a to 36c illustrated in FIG. 6 is as follows. That is, when the thickness of Au is 0.35 nm, the particle diameter is 25 nm, and the lattice constant distribution $\Delta d/d$ is 0.0028. When the thickness of Au is 0.17 nm, the particle diameter is 25 nm, and the lattice constant distribution $\Delta d/d$ is 0.0055. When the thickness of Au is 0.10 nm, the particle diameter is 20 nm, and the lattice constant distribution $\Delta d/d$ is 0.0065.

Figure 7:
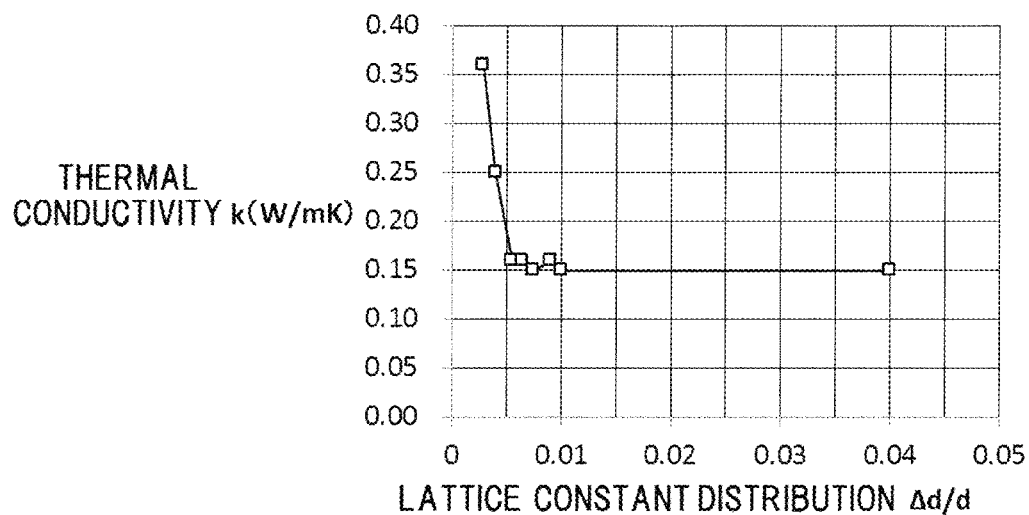
FIG. 7 is a diagram indicating the relationship between the lattice constant distribution $\Delta d/d$ and the thermal conductivity $\kappa$.

Here, the inventors have investigated the relationship between the obtained lattice constant distribution Δd/d and the thermal conductivity κ. FIG. 7 is a graph indicating the relationship between the lattice constant distribution Δd/d and the thermal conductivity κ. In FIG. 7, the vertical axis indicates the thermal conductivity (W/mK), and the horizontal axis indicates the lattice constant distribution Δd/d. The thermal conductivity κ is measured from the samples.

Referring to FIG. 7, regarding the relationship between the thermal conductivity κ and the lattice constant distribution Δd/d, when the lattice constant distribution Δd/d takes a value of 0.0028, the thermal conductivity κ is 0.36. When the lattice constant distribution Δd/d takes a value of 0.004, the thermal conductivity κ is 0.25. When the lattice constant distribution Δd/d takes a value of 0.0055, the thermal conductivity κ is 0.16. When the lattice constant distribution Δd/d takes a value of 0.0065, the thermal conductivity κ is 0.16. When the lattice constant distribution Δd/d takes a value of 0.0075, the thermal conductivity κ is 0.15. When the lattice constant distribution Δd/d takes a value of 0.0090, the thermal conductivity κ is 0.16. When the lattice constant distribution Δd/d takes a value of 0.010, the thermal conductivity κ is 0.15. When the lattice constant distribution Δd/d takes a value of 0.040, the thermal conductivity κ is 0.16. Here, regarding the thermal conductivity κ, a sufficiently small value can be obtained by setting the lattice constant distribution Δd/d to a value equal to or more than the threshold value, which is 0.0055. In other words, the thermal conductivity κ can be adjusted to a very small value by adjusting the value of the lattice constant distribution Δd/d to 0.0055 or more.

This is considered as follows. That is, when the variation in crystal composition and the composition strain of the nanoparticles 23 roughly indicated by the lattice constant distribution Δd/d of the nanoparticles 23 increase, a so-called compositional non-uniformity occurs. This promotes scattering of phonons having different frequencies. Presumably thus, the thermal conductivity κ can be sufficiently decreased. Thus, in such a thermoelectric conversion material 21, the dimensionless figure of merit ZT can be sufficiently increased, and the thermoelectric conversion efficiency can be improved. Presumably, when the nanoparticles 23 are constituted by covalent interatomic bonds, the relationship between phonon scattering and the compositional non-uniformity with which the lattice constant distribution Δd/d takes a value of 0.0055 or more can be applied. Moreover, the limit of the lattice constant distribution Δd/d of a covalent material is 0.04. The limit is the value determined from the lattice constants of Si and Ge in the Si—Ge compound, which is a covalently bonded all-proportional solid-solution. It is considered that the limit of the lattice constant distribution Δd/d is 0.04 for all other covalent crystal materials in the present disclosure.

The value of the lattice constant distribution Δd/d is preferably 0.04 or less. In this range, it is easy to form the thermoelectric conversion material 21 of the present application.

In the embodiment described above, the matrix 22 of the thermoelectric conversion material 21 is amorphous. However, this is not limiting, and the matrix 22 may be polycrystalline.

In the embodiment described above, the semiconductor is a SiGe-based material containing Si and Ge. However, this it not limiting, and the covalent semiconductor may be an AlMnSi-based material containing Al, Mn, and Si, or a BiTe-based material containing Bi and Te. Such a semiconductor is preferable for the thermoelectric conversion material of the present disclosure. This is because it is considered that the relationship between the compositional non-uniformity and the phonon scattering found in the present disclosure can be applied as long as the nanoparticles 23 are a crystallized covalent semiconductor material.

In the embodiment described above, Au is used as the additive element. However, this is not limiting, and the additive element may contain at least one of Au, Cu, Al, B, Ni, and Fe. These elements can serve as nuclei in the matrix composed of a semiconductor, and thus are preferable as the additive elements for inducing precipitation of the nanoparticles 23.

The particle diameter of the nanoparticles 23 is preferably 20 nm or less. In this manner, the phonon scattering can be enhanced and thus the thermal conductivity can be decreased. Moreover, the Seebeck coefficient can be increased, and, thus, ZT can be increased. Thus, thermoelectric conversion efficiency can be further improved. The particle diameter of the nanoparticles 23 is more preferably 10 nm or less and yet more preferably 5 nm or less. In this manner, phonon scattering can be further enhanced, and the thermal conductivity can be further decreased.

Embodiment 2

Next, a power generating element and a power generating module, which are embodiments of the thermoelectric conversion element and the thermoelectric conversion module that use the thermoelectric conversion material of the present disclosure, are described.

Figure 8:
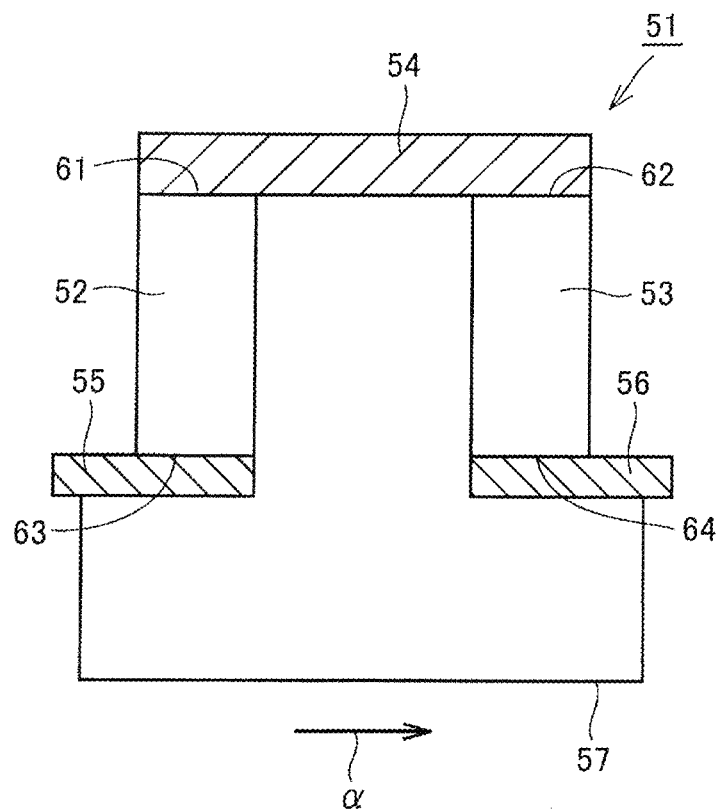
FIG. 8 is a schematic diagram illustrating a structure of a π-type thermoelectric conversion element (power generating element), which is a thermoelectric conversion element of this embodiment.

FIG. 8 is a schematic diagram illustrating a structure of a π-type thermoelectric conversion element (power generating element) 51, which is a thermoelectric conversion element of this embodiment. Referring to FIG. 8, the π-type thermoelectric conversion element 51 includes a p-type thermoelectric conversion material unit 52 that serves as a first thermoelectric conversion material unit, an n-type thermoelectric conversion material unit 53 which serves as a second thermoelectric conversion material unit, a high-temperature-side electrode 54, a first low-temperature-side electrode 55, a second low-temperature-side electrode 56, and a wire 57.

The p-type thermoelectric conversion material unit 52 is, for example, composed of the thermoelectric conversion material of embodiment 1 in which the component composition is adjusted to set the conductivity type to p-type. The conductivity type of the p-type thermoelectric conversion material unit 52 is set to p-type, for example, by doping the thermoelectric conversion material of embodiment 1 constituting the p-type thermoelectric conversion material unit 52 with a p-type impurity that generates a p-type carrier (holes) that serves as a majority carrier.

The n-type thermoelectric conversion material unit 53 is composed of, for example, the thermoelectric conversion material of embodiment 1 in which the component composition is adjusted to set the conductivity type to n-type. The conductivity type of the n-type thermoelectric conversion material unit 53 is set to n-type, for example, by doping the thermoelectric conversion material of embodiment 1 constituting the n-type thermoelectric conversion material unit 53 with an n-type impurity that generates an n-type carrier (electrons) that serves as a majority carrier.

The p-type thermoelectric conversion material unit 52 and the n-type thermoelectric conversion material unit 53 are arranged side-by-side with a space therebetween. The high-temperature-side electrode 54 is arranged to extend from one end portion 61 of the p-type thermoelectric conversion material unit 52 to one end portion 62 of the n-type thermoelectric conversion material unit 53. The high-temperature-side electrode 54 is arranged to contact both the end portion 61 of the p-type thermoelectric conversion material unit 52 and the end portion 62 of the n-type thermoelectric conversion material unit 53. The high-temperature-side electrode 54 is arranged to connect the end portion 61 of the p-type thermoelectric conversion material unit 52 and the end portion 62 of the n-type thermoelectric conversion material unit 53. The high-temperature-side electrode 54 is composed of, for example, a conductive material such as a metal. The high-temperature-side electrode 54 makes an ohmic contact with the p-type thermoelectric conversion material unit 52 and the n-type thermoelectric conversion material unit 53.

The thermoelectric conversion material unit 52 or the thermoelectric conversion material unit 53 is preferably p-type or n-type; however, alternatively, one the thermoelectric conversion material units 52 and 53 may be a metal conductor.

In the embodiment described above, a π-type thermoelectric conversion element is described as one example of the thermoelectric conversion element of the present application, but the thermoelectric conversion element of the present application is not limited to this. The thermoelectric conversion element of the present application may have other structures such as an I-type (uni-leg type) thermoelectric conversion element, for example.

The first low-temperature-side electrode 55 is arranged to contact another end portion 63 of the p-type thermoelectric conversion material unit 52. The first low-temperature-side electrode 55 is arranged to be apart from the high-temperature-side electrode 54. The first low-temperature-side electrode 55 is composed of, for example, a conductive material such as a metal. The first low-temperature-side electrode 55 makes an ohmic contact with the p-type thermoelectric conversion material unit 52.

The second low-temperature-side electrode 56 is arranged to contact another end portion 64 of the n-type thermoelectric conversion material unit 53. The second low-temperature-side electrode 56 is arranged to be apart from the high-temperature-side electrode 54 and the first low-temperature-side electrode 55. The second low-temperature-side electrode 56 is composed of, for example, a conductive material such as a metal. The second low-temperature-side electrode 56 makes an ohmic contact with the n-type thermoelectric conversion material unit 53.

The wire 57 is composed of a conductor such as a metal. The wire 57 electrically connects the first low-temperature-side electrode 55 and the second low-temperature-side electrode 56.

In the π-type thermoelectric conversion element 51, when, for example, a temperature difference is formed between the high temperature at the end portion 61 of the p-type thermoelectric conversion material unit 52 and the end portion 62 of the n-type thermoelectric conversion material unit 53 and the low temperature at the end portion 63 of the p-type thermoelectric conversion material unit 52 and the end portion 64 of the n-type thermoelectric conversion material unit 53, the p-type carrier (holes) migrates in the p-type thermoelectric conversion material unit 52 from the end portion 61 toward the end portion 63. During this process, in the n-type thermoelectric conversion material unit 53, the n-type carrier (electrons) migrates from the end portion 62 toward the end portion 64. As a result, an electric current flows in the wire 57 in the arrow a direction. Thus, in the π-type thermoelectric conversion element 51, power is generated by the thermoelectric conversion using the temperature difference. In other words, the π-type thermoelectric conversion element 51 is a power generating element.

The thermoelectric conversion material of embodiment 1 in which the value of ZT is increased by sufficiently decreasing the thermal conductivity is employed as the material that makes up the p-type thermoelectric conversion material unit 52 and the n-type thermoelectric conversion material unit 53. As a result, the π-type thermoelectric conversion element 51 serves as a high-efficiency power generating element.

Furthermore, a power generating module that serves as a thermoelectric conversion module can be obtained by electrically connecting multiple π-type thermoelectric conversion elements 51. A power generating module 65, which is a thermoelectric conversion module of this embodiment, has a structure in which multiple π-type thermoelectric conversion elements 51 are connected in series.

Figure 9:
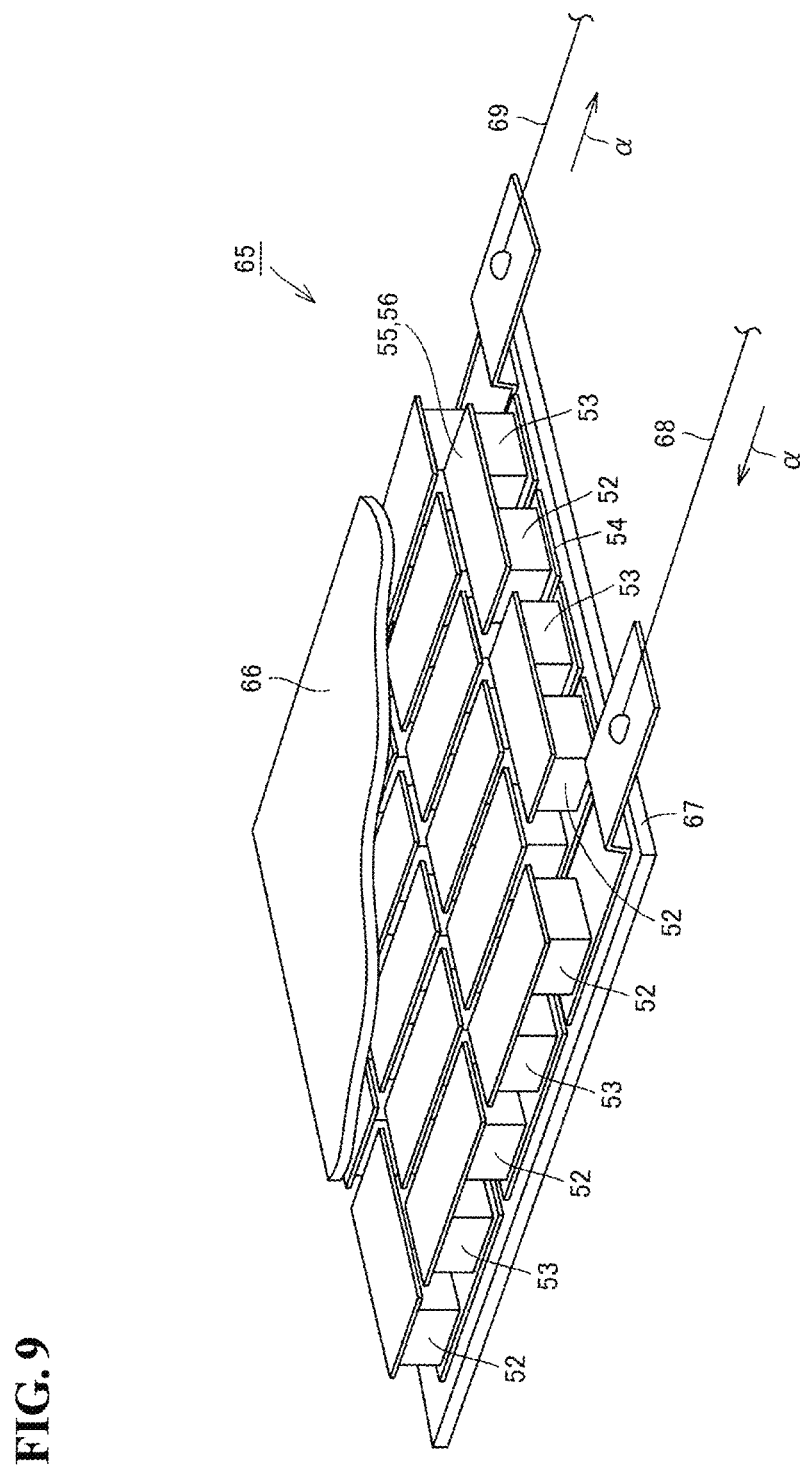
FIG. 9 is a diagram illustrating one example of a structure of a power generating module.

FIG. 9 is a diagram illustrating one example of a structure of the power generating module 65. Referring to FIG. 9, the power generating module 65 of this embodiment includes p-type thermoelectric conversion material units 52, n-type thermoelectric conversion material units 53, and low-temperature-side electrodes 55, 56 each corresponding to the first low-temperature-side electrode 55 and the second low-temperature-side electrode 56, high-temperature-side electrodes 54, a low-temperature-side insulator substrate 66, and a high-temperature-side insulator substrate 67. The low-temperature-side insulator substrate 66 and the high-temperature-side insulator substrate 67 are composed of a ceramic such as alumina. The p-type thermoelectric conversion material units 52 and the n-type thermoelectric conversion material units 53 are alternately arranged side-by-side. The low-temperature-side electrodes 55, 56 are arranged to be in contact with the p-type thermoelectric conversion material units 52 and the n-type thermoelectric conversion material units 53 as with the π-type thermoelectric conversion element 51 described above. The high-temperature-side electrode 54 is arranged to be in contact with the p-type thermoelectric conversion material units 52 and the n-type thermoelectric conversion material units 53 as with the π-type thermoelectric conversion element 51 described above. Each p-type thermoelectric conversion material unit 52 is connected to an adjacent n-type thermoelectric conversion material unit 53 on one side via a common high-temperature-side electrode 54. Each p-type thermoelectric conversion material unit 52 is connected to an adjacent n-type thermoelectric conversion material unit 53 on another side different from the aforementioned one side via common low-temperature-side electrode 55, 56.

As a result, all of the p-type thermoelectric conversion material units 52 and the n-type thermoelectric conversion material units 53 are connected in series.

The low-temperature-side insulator substrate 66 is disposed on a main surface side of the plate-shaped low-temperature-side electrode 55, 56, the main surface side being opposite to the side contacting the p-type thermoelectric conversion material units 52 and the n-type thermoelectric conversion material units 53.

One low-temperature-side insulator substrate 66 is provided for multiple (all) low-temperature-side electrodes 55, 56. The high-temperature-side insulator substrate 67 is disposed on a side of the plate-shaped high-temperature-side electrodes 54, the side being opposite to the side contacting the p-type thermoelectric conversion material units 52 and the n-type thermoelectric conversion material units 53. One high-temperature-side insulator substrate 67 is provided for multiple (all) high-temperature-side electrodes 54.

Wires 68 and 69 are respectively connected to the high-temperature-side electrodes 54 or low-temperature-side electrodes 55, 56 that contact the p-type thermoelectric conversion material units 52 or n-thermoelectric conversion material units 53 located at two ends among the serially connected p-type thermoelectric conversion material units 52 and the n-type thermoelectric conversion material units 53. When a temperature difference is formed between the high temperature on the side of the high-temperature-side insulator substrate 67 and the low temperature on the side of the low-temperature-side insulator substrate 66, an electric current flows in the arrow c direction through the serially connected p-type thermoelectric conversion material units 52 and the n-type thermoelectric conversion material units 53 as in the aforementioned case of the π-type thermoelectric conversion element 51. Thus, in the power generating module 65, power is generated by thermoelectric conversion using the temperature difference.

Embodiment 3

Next, an infrared sensor, which is an optical sensor, is described as another embodiment of the thermoelectric conversion element that uses the thermoelectric conversion material of the present disclosure.

Figure 10:
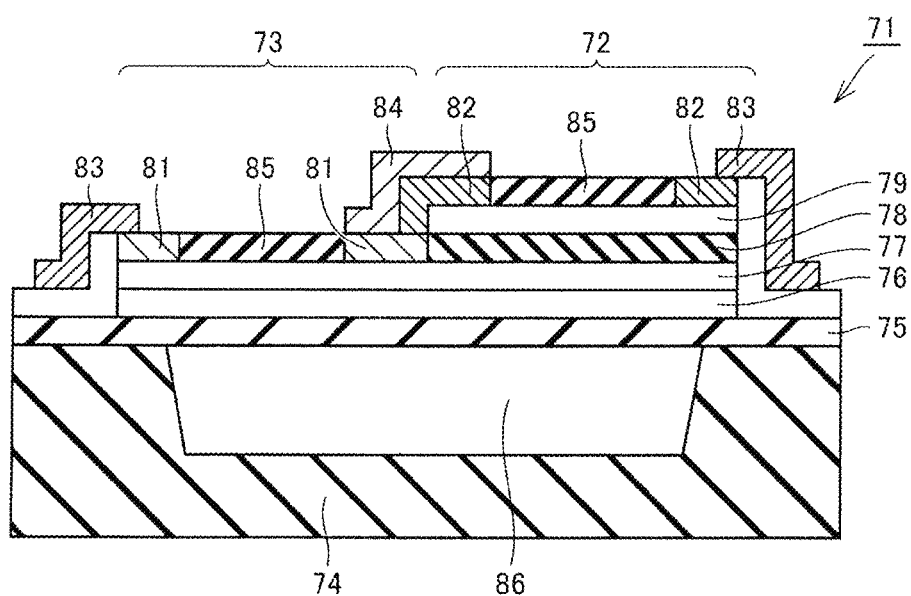
FIG. 10 is a diagram illustrating one example of a structure of an infrared sensor.

FIG. 10 is a diagram illustrating one example of a structure of an infrared sensor 71. Referring to FIG. 10, the infrared sensor 71 includes a p-type thermoelectric conversion unit 72 and an n-type thermoelectric conversion unit 73 that are arranged to be adjacent to each other. The p-type thermoelectric conversion unit 72 and the n-type thermoelectric conversion unit 73 are formed on a substrate 74.

The infrared sensor 71 includes the substrate 74, an etching stop layer 75, an n-type thermoelectric conversion material layer 76, an n$^+$-type ohmic contact layer 77, an insulator layer 78, a p-type thermoelectric conversion material layer 79, an n-side ohmic contact electrode 81, a p-side ohmic contact electrode 82, a heat-absorbing pad 83, an absorber 84, and a protective film 85.

The substrate 74 is composed of an insulator such as silicon dioxide. A recess 86 is formed in the substrate 74. The etching stop layer 75 is formed to cover the surface of the substrate 74. The etching stop layer 75 is composed of, for example, an insulator such as silicon nitride. A space is formed between the etching stop layer 75 and the recess 86 in the substrate 74.

The n-type thermoelectric conversion material layer 76 is formed on a main surface of the etching stop layer 75, the main surface being on the opposite side of the substrate 74. The n-type thermoelectric conversion material layer 76 is composed of the thermoelectric conversion material of embodiment 1 in which the component composition is adjusted to set the conductivity type to n-type, for example. The conductivity type of the n-type thermoelectric conversion material layer 76 is set to n-type, for example, by doping the thermoelectric conversion material of embodiment 1 constituting the n-type thermoelectric conversion material layer 76 with an n-type impurity that generates an n-type carrier (electrons) that serves as a majority carrier. The n$^+$-type ohmic contact layer 77 is formed on a main surface of the n-type thermoelectric conversion material layer 76, the main surface being on the opposite side of the etching stop layer 75. The n$^+$-type ohmic contact layer 77 is, for example, doped with an n-type impurity that generates an n-type carrier (electrons) that serves as a majority carrier so that the concentration of the n-type impurity is higher than in the n-type thermoelectric conversion material layer 76. As a result, the conductivity type of the n$^+$-type ohmic contact layer 77 is n-type.

The n-side ohmic contact electrode 81 is disposed so as to contact a center portion of a main surface of the n$^+$-type ohmic contact layer 77, the main surface being on the opposite side of the n-type thermoelectric conversion material layer 76. The n-side ohmic contact electrode 81 is composed of a material that can make an ohmic contact with the n$^+$-type ohmic contact layer 77, for example, a metal. The insulator layer 78 composed of an insulator such as silicon dioxide is disposed on a main surface of the n$^+$-type ohmic contact layer 77, the main surface being on the opposite side of the n-type thermoelectric conversion material layer 76. The insulator layer 78 is disposed on a main surface of the n$^+$-type ohmic contact layer 77, the main surface being on the p-type thermoelectric conversion unit 72 side when viewed from the n-side ohmic contact electrode 81.

The protective film 85 is further provided on a main surface of the n$^+$-type ohmic contact layer 77, the main surface being on the opposite side of the n-type thermoelectric conversion material layer 76. The protective film 85 is disposed on a main surface of the n$^+$-type ohmic contact layer 77, the main surface being on the opposite side of the p-type thermoelectric conversion layer 72 when viewed from the n-side ohmic contact electrode 81. Another n-side ohmic contact electrode 81 is disposed on a main surface of the n$^+$-type ohmic contact layer 77, the main surface being on the opposite side of the n-type thermoelectric conversion material layer 76, is disposed on the opposite side of the aforementioned n-side ohmic contact electrode 81 with the protective film 85 therebetween.

The p-type thermoelectric conversion material layer 79 is disposed on a main surface of the insulator layer 78, the main surface being on the opposite side of the n$^+$-type ohmic contact layer 77. The p-type thermoelectric conversion material layer 79 is composed of the thermoelectric conversion material of embodiment 1 in which the component composition is adjusted to set the conductivity type to p-type. The conductivity type of the p-type thermoelectric conversion material layer 79 is set to p-type, for example, by doping the thermoelectric conversion material of embodiment 1 constituting the p-type thermoelectric conversion material layer 79 with a p-type impurity that generates a p-type carrier (holes) that serves as a majority carrier.

The protective film 85 is disposed in a center portion on a main surface of the p-type thermoelectric conversion material layer 79, the main surface being on the opposite side of the insulator layer 78. A pair of p-side ohmic contact electrodes 82 that flank the protective film 85 are disposed on a main surface of the p-type thermoelectric conversion material layer 79, the main surface being on the opposite side of the insulator layer 78. The p-side ohmic contact electrodes 82 are composed of a material that can make an ohmic contact with the p-type thermoelectric conversion material layer 79, for example, a metal. Of the pair of the p-side ohmic contact electrodes 82, the p-side ohmic contact electrode 82 on the n-type thermoelectric conversion unit 73 side is connected to the n-side ohmic contact electrode 81.

The absorber 84 is disposed to cover main surfaces of the n-side ohmic contact electrode 81 and the p-side ohmic contact electrode 82 connected to each other, the main surfaces being on the opposite side of the n$^+$-type ohmic contact layer 77. The absorber 84 is composed of, for example, titanium. The heat-absorbing pad 83 is disposed so as to contact the top of the n-side ohmic contact electrode 81 not connected to the p-side ohmic contact electrode 82. The heat-absorbing pad 83 is disposed so as to contact the top of the p-side ohmic contact electrode 82 not connected to the n-side ohmic contact electrode 81. An example of the material constituting the heat-absorbing pad 83 is gold (Au)/titanium (Ti).

When an infrared ray is applied to the infrared sensor 71, the absorber 84 absorbs the energy of the infrared ray. As a result, the temperature of the absorber 84 rises. Meanwhile, the increase in temperature of the heat-absorbing pad 83 is suppressed. Thus, a temperature difference is formed between the absorber 84 and the heat-absorbing pad 83. Thus, in the p-type thermoelectric conversion material layer 79, the p-type carrier (holes) migrates from the absorber 84 toward the heat-absorbing pad 83. Meanwhile, in the n-type thermoelectric conversion material layer 76, the n-type carrier (electrons) migrates from the absorber 84 toward the heat-absorbing pad 83. Then, an electric current generated as a result of the migration of the carriers from the n-side ohmic contact electrode 81 and the p-side ohmic contact electrode 82 is extracted and the infrared ray is detected as a result.

The infrared sensor 71 of this embodiment employs the thermoelectric conversion material of embodiment 1, in which the value of ZT is increased by sufficiently decreasing the thermal conductivity, as the material that makes up the p-type thermoelectric conversion material layer 79 and the n-type thermoelectric conversion material layer 76. Thus, the infrared sensor 71 exhibits high sensitivity.

The embodiments disclosed herein are exemplary in all aspects, and should not be understood as limiting from any respect. The scope of the present invention is defined not by the descriptions above but by the claims and is intended to include all alterations and modifications within the meaning of the claims and equivalents thereof.

REFERENCE SIGNS LIST

11 multilayer body
12 sapphire substrate
13 amorphous Si layer
14, 16 amorphous Ge layer
15 Au layer
17 multilayer unit
21 thermoelectric conversion material
22 matrix
23 nanoparticle
31, 34*a*, 34*b*, 34*c*, 34*d*, 34*e*, 34*f*, 34*g*, 34*h*, 34*i*, 34*j*, 34*k*, 34*l*, 34*m* peak
32 solid line
33 broken line
36*a*, 36*b*, 36*c* straight line
51 π-type thermoelectric conversion element
52 p-type thermoelectric conversion material unit
53 n-type thermoelectric conversion material unit
54 high-temperature-side electrode
55 first low-temperature-side electrode (low-temperature-side electrode)
56 second low-temperature-side electrode (low-temperature-side electrode)
57, 68, 69 wire
61, 62, 63, 64 end portion
65 power generating module
66 low-temperature-side insulator substrate
67 high-temperature-side insulator substrate
71 infrared sensor
72 p-type thermoelectric conversion unit
73 n-type thermoelectric conversion unit
74 substrate
75 etching stop layer
76 n-type thermoelectric conversion material layer
77 n$^+$-type ohmic contact layer
78 insulator layer
79 p-type thermoelectric conversion material layer
81 n-side ohmic contact electrode
82 p-side ohmic contact electrode
83 heat-absorbing pad
84 absorber
85 protective film

The invention claimed is:

1. A thermoelectric conversion material comprising:
a matrix consisting of a semiconductor; and
nanoparticles disposed in the matrix,
wherein the nanoparticles have a lattice constant distribution $\Delta d/d$ of 0.0055 or more.

2. The thermoelectric conversion material according to claim 1, wherein the matrix is amorphous.

3. The thermoelectric conversion material according to claim 1, wherein the nanoparticles have a lattice constant distribution $\Delta d/d$ of 0.04 or less.

4. The thermoelectric conversion material according to claim 1, wherein the nanoparticles have a particle diameter of 20 nm or less.

5. The thermoelectric conversion material according to claim 1, wherein the semiconductor is an SiGe-based material containing Si and Ge, an AlMnSi-based material containing Al, Mn, and Si, or a BiTe-based material containing Bi and Te.

6. The thermoelectric conversion material according to claim 1, containing, as an additive element, at least one of Au, Cu, Al, B, Ni, and Fe.

7. The thermoelectric conversion material according to claim 2, wherein the nanoparticles have a lattice constant distribution $\Delta d/d$ of 0.04 or less.

8. The thermoelectric conversion material according to claim 2, wherein the nanoparticles have a particle diameter of 20 nm or less.

9. The thermoelectric conversion material according to claim 3, wherein the nanoparticles have a particle diameter of 20 nm or less.

10. The thermoelectric conversion material according to claim 2, wherein the semiconductor is an SiGe-based material containing Si and Ge, an AlMnSi-based material containing Al, Mn, and Si, or a BiTe-based material containing Bi and Te.

11. The thermoelectric conversion material according to claim 3, wherein the semiconductor is an SiGe-based material containing Si and Ge, an AlMnSi-based material containing Al, Mn, and Si, or a BiTe-based material containing Bi and Te.

12. The thermoelectric conversion material according to claim 4, wherein the semiconductor is an SiGe-based material containing Si and Ge, an AlMnSi-based material containing Al, Mn, and Si, or a BiTe-based material containing Bi and Te.

13. The thermoelectric conversion material according to claim 9, wherein the semiconductor is an SiGe-based material containing Si and Ge, an AlMnSi-based material containing Al, Mn, and Si, or a BiTe-based material containing Bi and Te.

14. The thermoelectric conversion material according to claim 2, containing, as an additive element, at least one of Au, Cu, Al, B, Ni, and Fe.

15. The thermoelectric conversion material according to claim 3, containing, as an additive element, at least one of Au, Cu, Al, B, Ni, and Fe.

16. The thermoelectric conversion material according to claim 4, containing, as an additive element, at least one of Au, Cu, Al, B, Ni, and Fe.

17. The thermoelectric conversion material according to claim 5, containing, as an additive element, at least one of Au, Cu, Al, B, Ni, and Fe.

18. The thermoelectric conversion material according to claim 10, containing, as an additive element, at least one of Au, Cu, Al, B, Ni, and Fe.

* * * * *